United States Patent
Nishio et al.

(10) Patent No.: US 12,406,844 B2
(45) Date of Patent: Sep. 2, 2025

(54) WAFER HAVING A SILICON CARBIDE CRYSTAL LAYER WITH STACKING FAULTS PROVIDED ON A SILICON CARBIDE BASE BODY AND SEMICONDUCTOR DEVICE MANUFACTURED USING THE WAFER

(71) Applicant: KABUSHIKI KAISHA TOSHIBA, Tokyo (JP)

(72) Inventors: Johji Nishio, Machida (JP); Chiharu Ota, Kawasaki (JP); Tatsuo Shimizu, Shinagawa (JP); Ryosuke Iijima, Setagaya (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 502 days.

(21) Appl. No.: 17/812,249

(22) Filed: Jul. 13, 2022

(65) Prior Publication Data
US 2023/0107057 A1    Apr. 6, 2023

(30) Foreign Application Priority Data
Oct. 5, 2021   (JP) ................. 2021-163826

(51) Int. Cl.
*H01L 21/02* (2006.01)
*H10D 62/832* (2025.01)

(52) U.S. Cl.
CPC .. *H01L 21/02378* (2013.01); *H01L 21/02433* (2013.01); *H10D 62/8325* (2025.01)

(58) Field of Classification Search
CPC ......... H01L 21/02378; H01L 21/02433; H01L 29/1608

(Continued)

(56) References Cited

U.S. PATENT DOCUMENTS 11,031,238 B2    6/2021   Konishi et al.
2013/0320357 A1* 12/2013  Aigo ................. C30B 25/02
                                              257/77

(Continued)

FOREIGN PATENT DOCUMENTS

JP    2014-146748 A    8/2014
JP    2014-175412 A    9/2014

(Continued)

OTHER PUBLICATIONS

R. Hattori et al, "PL Imaging Study of In-Grown Stacking Faults in 4H—SiC Epitaxial Layer", (Mar. 2, 2009), Materials Science Forum vols. 615-617, pp. 129-132. (Year: 2009).*

(Continued)

*Primary Examiner* — Norman D Richards
*Assistant Examiner* — Colin Russell McCutcheon
(74) *Attorney, Agent, or Firm* — Oblon, McClelland, Maier & Neustadt, L.L.P.

(57) ABSTRACT

According to one embodiment, a wafer includes a base body including a first surface, and a crystal layer provided on the first surface. The crystal layer includes first stacking faults and one or second stacking faults. One of the first stacking faults includes a first long side, a first short side, and a first hypotenuse. A position of the first long side in a first direction from the base body to the crystal layer is between the base body in the first direction and a first corner portion in the first direction. One of the one or the plurality of second stacking faults includes a second long side, a second short side, and a second hypotenuse. A position of a second corner portion in the first direction is between the base body in the first direction and the second long side in the first direction.

20 Claims, 5 Drawing Sheets

(58) Field of Classification Search
USPC .......................................................... 257/77
See application file for complete search history.

(56) References Cited

U.S. PATENT DOCUMENTS

| | | |
|---|---|---|
| 2014/0209927 A1 | 7/2014 | Nishio et al. |
| 2014/0252378 A1* | 9/2014 | Ota .................... H01L 29/045 |
| | | 257/77 |
| 2020/0251560 A1* | 8/2020 | Nishio ................ H01L 29/1608 |

FOREIGN PATENT DOCUMENTS

| | | |
|---|---|---|
| JP | 6244826 B2 | 12/2017 |
| JP | 2019-186460 A | 10/2019 |
| JP | 2020-126919 A | 8/2020 |
| JP | 6791274 B2 | 11/2020 |

OTHER PUBLICATIONS

Hayashi et al., Origin Analysis of Expanded Stacking Faults by Applying Forward Current to 4H—SiC p-i-n Diodes, Applied Physics Express vol. 10, 081201, 2017, pp. 1-5.

Jacobson et al., Properties and Origins of Different Stacking Faults that Cause Degradation in SiC PiN Diodes, Journal of Applied Physics vol. 95, No. 3, 1485, 2004, pp. 1-5.

* cited by examiner

WAFER HAVING A SILICON CARBIDE CRYSTAL LAYER WITH STACKING FAULTS PROVIDED ON A SILICON CARBIDE BASE BODY AND SEMICONDUCTOR DEVICE MANUFACTURED USING THE WAFER

CROSS-REFERENCE TO RELATED APPLICATIONS

This application is based upon and claims the benefit of priority from Japanese Patent Application No. 2021-163826, filed on Oct. 5, 2021; the entire contents of which are incorporated herein by reference.

FIELD

Embodiments described herein relate generally to a wafer and a semiconductor device.

BACKGROUND

For example, a semiconductor device is manufactured using a wafer including silicon carbide. Stable characteristics are desired in semiconductor devices.

DETAILED DESCRIPTION

Figure 1:
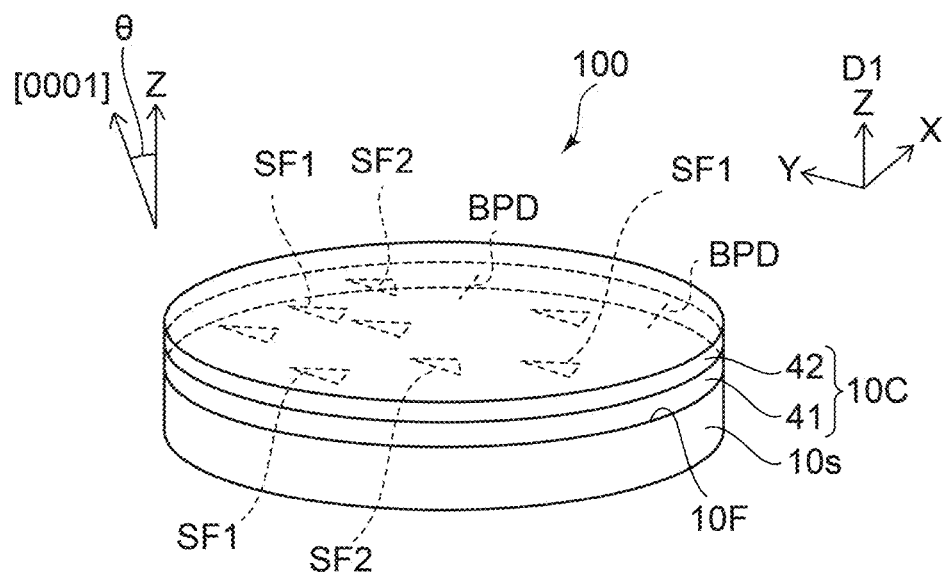
FIG. 1 is a schematic perspective view illustrating a wafer according to a first embodiment.

According to one embodiment, a wafer includes a base body including a first surface, and a crystal layer provided on the first surface. The base body includes silicon carbide. The crystal layer includes silicon carbide. The crystal layer includes a plurality of first stacking faults and one or a plurality of second stacking faults. One of the first stacking faults includes a first long side, a first short side, and a first hypotenuse. A length of the first long side is longer than a length of the first short side. An angle between the first long side and the first short side is substantially a right angle. The first long side is along the first surface. A position of the first long side in a first direction from the base body to the crystal layer is between a position of the base body in the first direction and a position of a first corner portion in the first direction. The first corner portion is between the first short side and the first hypotenuse. One of the one or the plurality of second stacking faults includes a second long side, a second short side, and a second hypotenuse. A length of the second long side is longer than a length of the second short side. An angle between the second long side and the second short side is substantially a right angle. The second long side is along the first surface. A position of a second corner portion in the first direction is between the position of the base body in the first direction and a position of the second long side in the first direction. The second corner portion is between the second short side and the second hypotenuse. A first density of the first stacking faults in the crystal layer is higher than a second density of the one or the second stacking faults in the crystal layer.

According to one embodiment, a wafer includes a base body including a first surface, and a crystal layer provided on the first surface. The base body includes silicon carbide. The crystal layer includes silicon carbide. The crystal layer includes one or a plurality of first stacking faults. One of the one or the plurality of first stacking faults includes a first long side, a first short side, and a first hypotenuse. A length of the first long side is longer than a length of the first short side. An angle between the first long side and the first short side is substantially a right angle. The first long side is along the first surface. A position of the first long side in a first direction from the base body to the crystal layer is between a position of the base body in the first direction and a position of a first corner portion in the first direction. The first corner portion is between the first short side and the first hypotenuse. The crystal layer does not include a second stacking fault. The second stacking fault includes a second long side, a second short side, and a second hypotenuse. A length of the second long side is longer than a length of the second short side. An angle between the second long side and the second short side is substantially a right angle. The second long side is along the first surface. A position of a second corner portion in the first direction is between the position of the base body in the first direction and a position of the second long side in the first direction. The second corner portion is between the second short side and the second hypotenuse.

According to one embodiment, a semiconductor device includes at least a part of any one of the wafers described above, a first electrode, and a second electrode. The first electrode is electrically connected to a part of the crystal layer. The second electrode is electrically connected to an other part of the crystal layer.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

FIG. 1 is a schematic perspective view illustrating a wafer according to a first embodiment.

As shown in FIG. 1, a wafer 100 according to the embodiment includes a base body 10s and a crystal layer 10C. The base body 10s includes silicon carbide (SiC). The base body 10s is, for example, a silicon carbide crystal substrate. The base body 10s includes a first surface 10F. The first surface 10F is, for example, an upper surface. SiC may include 4H—SiC, 6H—SiC, or 3C—SiC, for example.

The crystal layer 10C is provided on the first surface 10F. The crystal layer 10C is in contact with the first surface 10F. The crystal layer 10C includes silicon carbide. The crystal layer 10C is an epitaxial growth layer of silicon carbide.

In this example, the crystal layer 10C includes a first crystal region 41 and a second crystal region 42. The first crystal region 41 is between the base body 10s and the second crystal region 42. A concentration of impurity in the second crystal region 42 is higher than a concentration of impurity in the first crystal region 41. In one example, this impurity is of p-type. In this case, the first crystal region 41 may be of n-type. For example, the first crystal region 41 includes a first element including at least one selected from the group consisting of N, P and As. The second crystal region 42 includes a second element including at least one selected from the group consisting of B, Al and Ga. As described above, the conductivity type may be different in the first crystal region 41 and the second crystal region 42. The concentration of the first element in the first crystal region 41 is, for example, not less than $5×10^{13}$ cm$^{-3}$ and not more than $5×10^{16}$ cm$^{-3}$. The concentration of the second element in the second crystal region 42 is, for example, $1×10^{17}$ cm$^{-3}$ and not more than $5×10^{20}$ cm$^{-3}$.

As shown in FIG. 1, the crystal layer 10C includes multiple first stacking faults SF1 and one or multiple second stacking faults SF2. These stacking faults are generated, for example, in the crystal layer 10C from the basal plane dislocation BPD connected to the basal plane dislocations of the base body 10s. For example, by irradiating the crystal layer 10C with ultraviolet rays or the like, stacking faults are expanded from the basal plane dislocation BPD generated in the crystal layer 10C. The stacking fault is, for example, a single Shockley type stacking fault.

There can be roughly two types of stacking faults. These correspond to the multiple first stacking faults SF1 and one or the multiple second stacking faults SF2.

As shown in FIG. 1, a first direction D1 from the base body 10s to the crystal layer 10C is defined as a Z-axis direction. One direction perpendicular to the Z-axis direction is defined as an X-axis direction. A direction perpendicular to the Z-axis direction and the X-axis direction is defined as a Y-axis direction. The base body 10s and the crystal layer 10C are layered.

The base body 10s and the crystal layer 10C spread substantially parallel to the X-Y plane.

The first surface 10F may be inclined with respect to the (0001) plane of the base body 10s. For example, the [0001] direction of the base body 10s may be inclined with respect to the Z-axis direction (first direction D1). For example, an angle θ between the [0001] direction of the base body 10s and the Z-axis direction (first direction D1) may be larger than 0 degrees and not more than 10 degrees. For example, an angle θ between the first surface 10F and the (0001) plane of the base body 10s may be larger than 0 degrees and not more than 10 degrees. The base body 10s is an offset substrate. The angle θ corresponds to the angle between the first surface 10F and the (0001) plane of the crystal layer 10C.

Hereinafter, an example of one of the multiple first stacking faults SF1 and one of the second stacking fault SF2 will be described.

Figure 2:
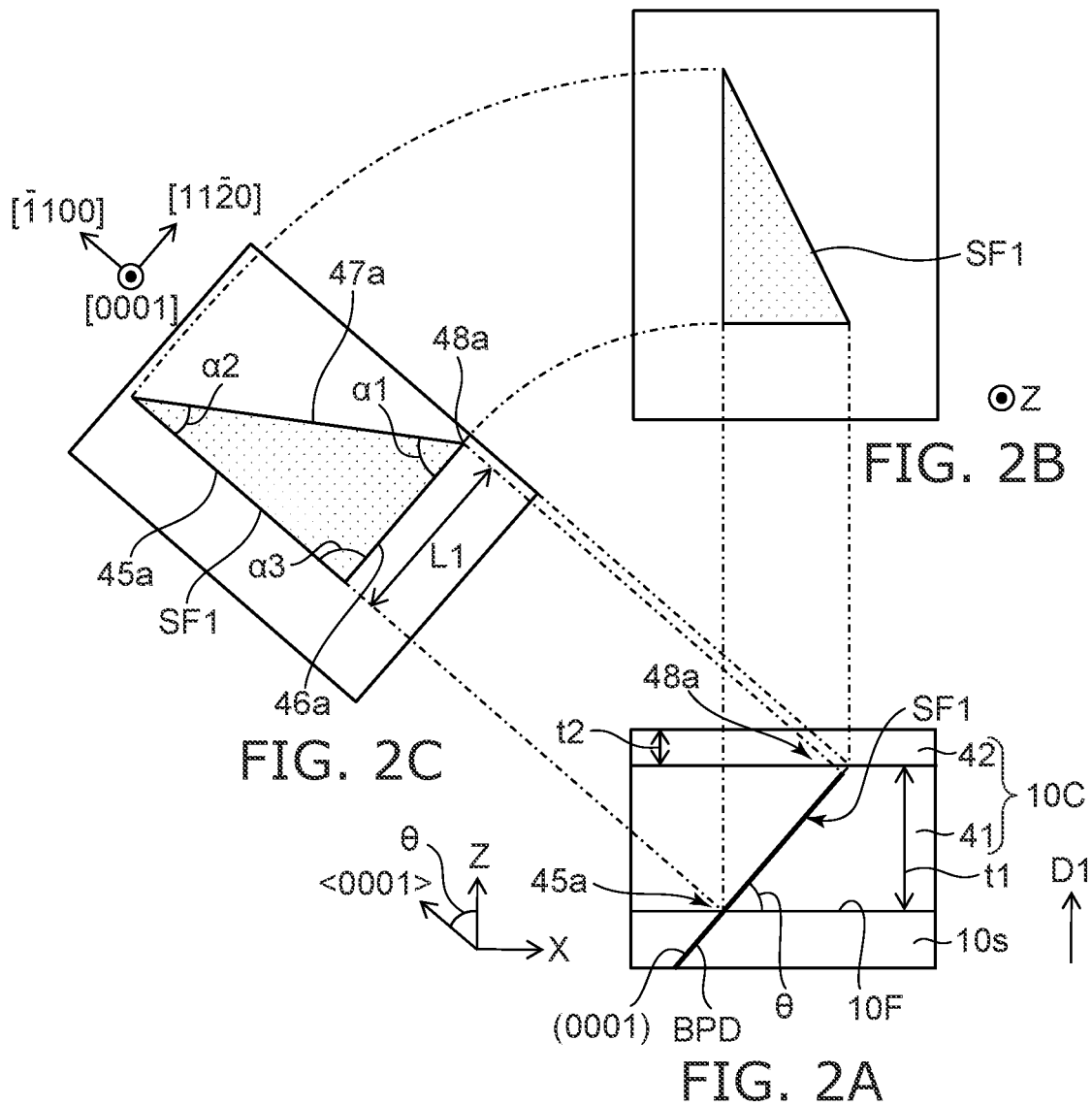
FIGS. 2A to 2C are schematic views illustrating a part of the wafer according to the first embodiment.

FIGS. 2A to 2C are schematic views illustrating a part of the wafer according to the first embodiment.

These figures illustrate the first stacking fault SF1. FIG. 2A is a cross-sectional view. FIG. 2B is a plan view taken along the Z-axis direction. FIG. 2C is a plan view taken along the direction.

As shown in FIGS. 2B and 2C, the first stacking fault SF1 has a right-angled triangular shape. As shown in FIG. 2C, one of the multiple first stacking faults SF1 includes a first long side 45a, a first short side 46a, and a first hypotenuse 47a. A length of the first long side 45a is longer than a length of the first short side 46a. An angle α3 between the first long side 45a and the first short side 46a is substantially a right angle. The first long side 45a is along the [-1100] direction of the crystal layer 10C. The first short side 46a is along the [11-20] direction of the crystal layer 10C.

In this specification, in a notation such as "[-1100]", "-" indicates that a "bar" is added to the number after "-".

There is a first corner portion 48a between the first short side 46a and the first hypotenuse 47a. An angle α1 (the angle of the first corner portion 48a) between the first short side 46a and the first hypotenuse 47a is substantially 60 degrees. An angle α2 between the first long side 45a and the first hypotenuse 47a is substantially 30 degrees.

As shown in FIGS. 2A and 2C, the first long side 45a is along the first surface 10F. The first long side 45a is along the X-Y plane. The first long side 45a is substantially perpendicular to the first direction D1.

As shown in FIG. 2A, a position of the first long side 45a in the first direction D1 is between a position of the base body 10s in the first direction D1 and a position of the first corner portion 48a in the first direction D1. As described above, the first corner portion 48a is a corner portion between the first short side 46a and the first hypotenuse 47a.

As shown in FIG. 2A, in the first stacking fault SF1, the first long side 45a is on a side (deep side) of the base body 10s. The first corner portion 48a is on a side (shallow side) far from the base body 10s.

Figure 3:
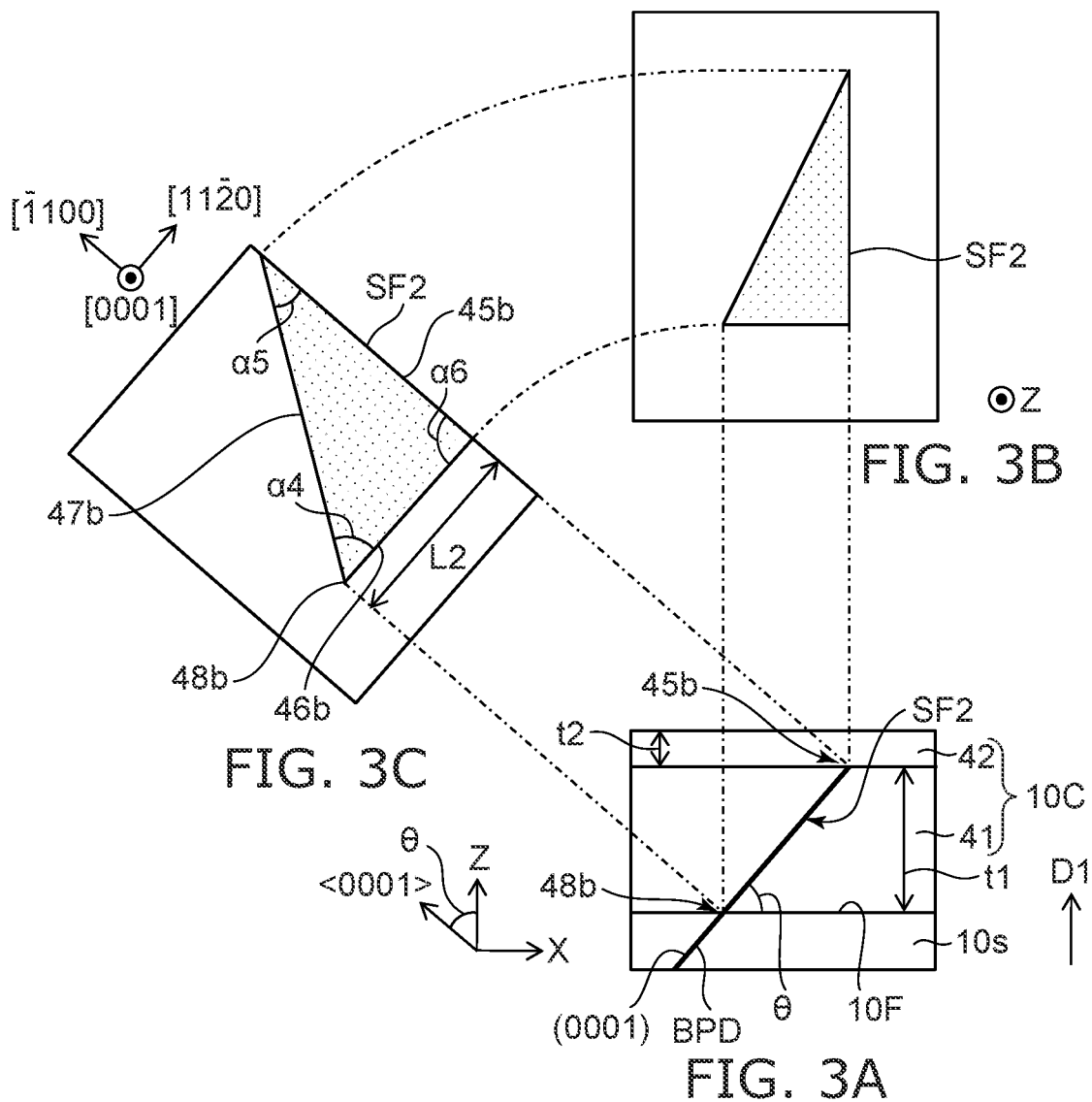
FIGS. 3A to 3C are schematic views illustrating a part of the wafer according to the first embodiment.

FIGS. 3A to 3C are schematic views illustrating a part of the wafer according to the first embodiment.

These figures illustrate the second stacking fault SF2. FIG. 3A is a cross-sectional view. FIG. 3B is a plan view taken along the Z-axis direction. FIG. 3C is a plan view taken along the direction.

As shown in FIGS. 3B and 3C, the second stacking fault SF2 has a right-angled triangular shape. As shown in FIG. 3C, one of the one or the plurality of second stacking faults SF2 includes a second long side 45b, a second short side 46b, and a second hypotenuse 47b. A length of the second long side 45b is longer than a length of the second short side 46b. An angle α6 between the second long side 45b and the second short side 46b is substantially a right angle. The second long side 45b is along the [-1100] direction of the crystal layer 10C. The second short side 46b is along the [11-20] direction of the crystal layer 10C.

There is a second corner portion 48b between the second short side 46b and the second hypotenuse 47b. An angle α4 (the angle of the second corner portion 48b) between the second short side 46b and the second hypotenuse 47b is substantially 60 degrees. An angle α5 between the second long side 45b and the second hypotenuse 47b is substantially 30 degrees.

As shown in FIGS. 3A and 3C, the second long side 45b is along the first surface 10F. The second long side 45b is along the X-Y plane. The second long side 45b is substantially perpendicular to the first direction D1.

As shown in FIG. 3A, a position of the second corner portion 48b in the first direction D1 is between a position of the base body 10s in the first direction D1 and a position of the second long side 45b in the first direction D1. As described above, the second corner portion 48b is a corner portion between the second short side 46b and the second hypotenuse 47b.

As shown in FIG. 3A, in the second stacking fault SF2, the second long side 45b is on a side (shallow side) far from the base body 10s. The second corner portion 48b is on a side (deep side) of the base body 10s.

As described above, the first stacking fault SF1 and the second stacking fault SF2 having different configurations may occur. In the embodiment, a first density of the multiple first stacking faults SF1 in the crystal layer 10C is higher than a second density of one or the multiple second stacking faults SF2 in the crystal layer 10C.

For example, a stacking fault may cause deterioration of the forward voltage Vf. Further, when the partial dislocation of the stacking fault reaches the p-type layer, the leakage current becomes large in the reverse direction characteristic, and the breakdown voltage failure may occur.

According to the study of the inventors, it was found that the second stacking fault SF2 is likely to cause deterioration, and the first stacking fault SF1 is unlikely to cause deterioration.

In the second stacking fault SF2, the second long side 45b exists on the shallow side. As shown in FIG. 3A, for example, the second long side 45b may be present in the second crystal region 42. Due to the shallow second long side 45b, deterioration of a forward voltage Vf is likely to occur. The leakage current tends to increase.

On the other hand, in the first stacking fault SF1, the first corner portion 48a exists on the shallow side. The first corner portion 48a is substantially a point and is short or has a small area. Therefore, the deterioration of the forward voltage Vf caused by the first corner portion 48a does not substantially occur. Deterioration of the forward voltage Vf is suppressed. In the first stacking fault SF1, the increase in the leakage current is suppressed.

The first stacking fault SF1 does not substantially adversely affect the characteristics. The second stacking fault SF2 adversely affects the characteristics. Therefore, by reducing the second stacking fault SF2, deterioration of the forward voltage Vf can be suppressed. The increase in leakage current is suppressed.

At this time, if the first stacking fault SF1 is reduced in addition to the reduction of the second stacking fault SF2, for example, the crystal layer 10C is likely to be distorted. For example, when the crystal layer 10C is epitaxially grown by step growth or the like, dislocations that are the basis of stacking faults occur. This dislocation relieves the stress generated in the crystal layer 10C. Due to the presence of the first stacking fault SF1, the stress in the crystal layer 10C is relaxed by the dislocations and the stacking faults extending from the dislocations, and the strain is suppressed. Due to the presence of the first stacking fault SF1, the crystal layer 10C having stable characteristics can be practically obtained.

In the embodiment, the first stacking fault SF1 that does not substantially cause deterioration of the forward voltage Vf is provided, and the second stacking fault SF2 that causes deterioration of the forward voltage Vf is reduced. As a result, deterioration of the forward voltage Vf can be suppressed while relaxing the stress and suppressing the strain. The increase in leakage current is suppressed. According to the embodiment, a wafer and a semiconductor device capable of stabilizing the characteristics are provided.

According to the study of the inventors, both the first stacking fault SF1 and the second stacking fault SF2 occur under one manufacturing condition. Each of the first stacking fault SF1 and the second stacking fault SF2 occurs with a certain probability of occurrence. Generally, the probability of occurrence of the second stacking fault SF2 is considered to be higher than the probability of occurrence of the first stacking fault SF1. In this case, the density of the first stacking fault SF1 is lower than the density of the second stacking fault SF2.

On the other hand, in the wafer 100 according to the embodiment, the density of the first stacking fault SF1 is higher than the density of the second stacking fault SF2. In one example, such a wafer 100 is obtained, for example, by sorting the manufactured wafer 100 by inspection.

For example, the wafer including the base body 10s and the crystal layer 10C is irradiated with ultraviolet rays or the like. This expands the stacking faults. The stacking faults include the first stacking fault SF1 and the second stacking fault SF2. The crystal layer 10C is irradiated with light, for example, and expanded stacking faults can be observed by photoluminescence imaging. Since the configurations of the first stacking fault SF1 and the second stacking fault SF2 are different, the existence of the first stacking fault SF1 and the second stacking fault SF2 can be easily distinguished. By observation, the amount of the second stacking fault SF2 can be inspected. For example, based on the inspection result, the wafer having many second stacking faults SF2 is not used for manufacturing the semiconductor device. Alternatively, the region in the wafer where the second stacking fault SF2 is abundant is not used as a product of the semiconductor device. By such a method, the wafer 100 in which the density of the first stacking fault SF1 is higher than the density of the second stacking fault SF2 can be obtained. A semiconductor device having the density of the first stacking fault SF1 higher than the density of the second stacking fault SF2 can be obtained.

In the embodiment, the method of obtaining the wafer 100 in which the density of the first stacking fault SF1 is higher than the density of the second stacking fault SF2 is arbitrary.

In the embodiment, for example, the first density is not less than 1.2 times the second density. For example, it is easy to stabilize the characteristics while suppressing distortion. The first density may be not less than twice the second density. For example, it is easy to further stabilize the characteristics while further suppressing the distortion.

As shown in FIG. 2A, the crystal layer 10C may include a first crystal region 41 and a second crystal region 42. The first crystal region 41 is between the base body 10s and the second crystal region 42. As described above, the concentration of impurity in the second crystal region 42 is higher than the concentration of the impurity in the first crystal region 41.

As shown in FIG. 2A, in the embodiment, the first corner portion 48a of the first stacking fault SF1 may be below an interface between the first crystal region 41 and the second crystal region 42. The first corner portion 48a is in the first crystal region 41 and may be separated from the second crystal region 42. For example, the position of the first corner portion 48a in the first direction D1 is between the position of the first long side 45a in the first direction D1 and the position of the second crystal region 42 in the first direction D1. By moving the first stacking fault SF1 away from the second crystal region 42, fluctuations in characteristics are further suppressed.

As shown in FIG. 2A, the angle between the first surface 10F and the (0001) plane of the crystal layer 10C corresponds to the angle $\theta$. The angle $\theta$ is, for example, greater than 0 and not more than 10 degrees. The first crystal region 41 has a first thickness t1 along the first direction D1. As shown in FIG. 2C, a length of the first short side 46a is defined as a length L1. As described above, the first corner portion 48a is in the first crystal region 41 and is separated from the second crystal region 42. In this case, the length L1 is smaller than $t1/\tan(\theta)$. By moving the first stacking fault SF1 away from the second crystal region 42, fluctuations in characteristics are further suppressed.

As shown in FIG. 3A, in the second stacking fault SF2, a length of the second short side 46b is defined as a length L2. The length L2 is, for example, not less than t1/tan (θ).

In the embodiment, the first short side 46a of the first stacking fault SF1 is shorter than the second short side 46b.

In the embodiment, the first thickness t1 is, for example, not less than 5 µm and not more than 150 µm. For example, at such a thickness, the first stacking fault SF1 and the second stacking fault SF2 are likely to occur.

The second thickness t2 (see FIGS. 2A and 3A) along the first direction D1 of the second crystal region 42 is, for example, not less than 0.3 µm and not more than 3 µm. In a semiconductor device using the wafer 100, appropriate characteristics can be obtained.

As shown in FIG. 1, the base body 10s includes multiple basal plane dislocations BPDs. As shown in FIGS. 2A and 2C, the first short side 46a of the first stacking fault SF1 is continuous with one of the multiple basal plane dislocations BPDs. As shown in FIGS. 3A and 3C, the second short side 46b of the second stacking fault SF2 is continuous with another one of the multiple basal plane dislocations BPDs.

In the embodiment, the crystal layer 10C does not have to include the second stacking fault SF2. Also in this case, the crystal layer 10C includes one or the multiple first stacking faults SF1.

Second Embodiment

The second embodiment relates to a semiconductor device. The semiconductor device includes at least a part of the wafer 100 according to the first embodiment and multiple electrodes (at least the first electrode and the second electrode). The first electrode is electrically connected to a part of the crystal layer 10C. The second electrode is electrically connected to another part of the crystal layer 10C.

Figure 4:
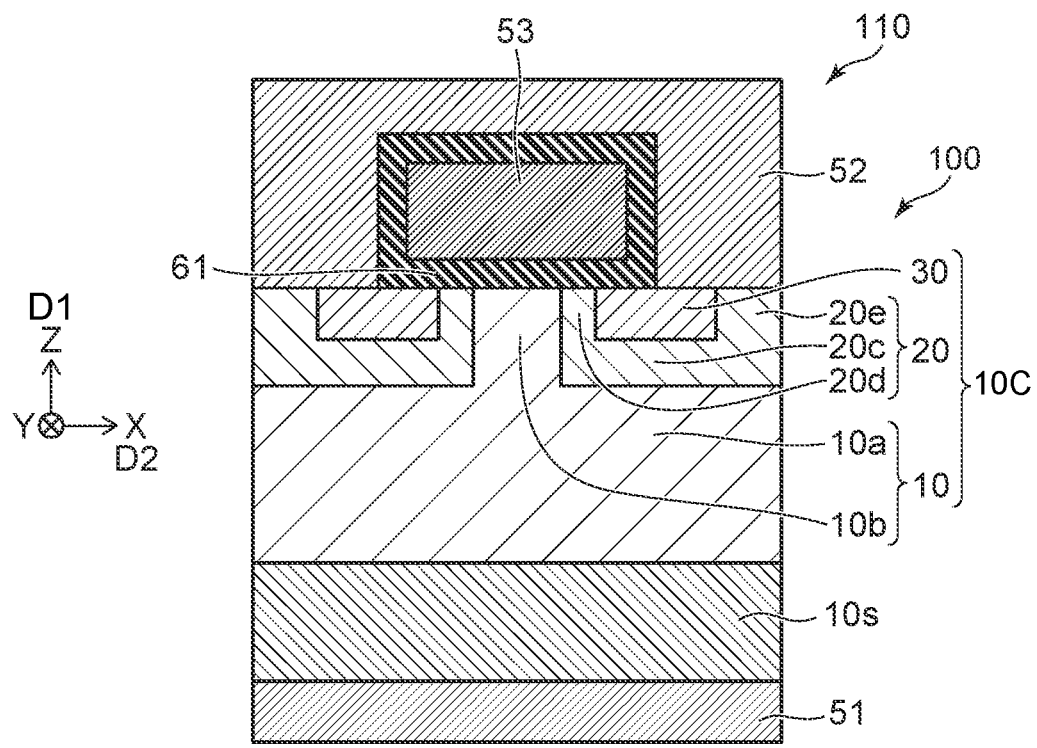
FIG. 4 is a schematic cross-sectional view illustrating a semiconductor device according to a second embodiment.

FIG. 4 is a schematic cross-sectional view illustrating a semiconductor device according to a second embodiment.

As shown in FIG. 4, a semiconductor device 110 according to the embodiment includes at least a part of the wafer 100, a first electrode 51, a second electrode 52, a third electrode 53, and an insulating portion 61.

At least a portion of the base body 10s is between the first electrode 51 and the second electrode 52 in the first direction D1. At least a part of the crystal layer 10C is between the base body 10s and the second electrode 52 in the first direction D1.

The crystal layer 10C includes a first semiconductor region 10 of a first conductivity type, a second semiconductor region 20 of a second conductivity type, and a third semiconductor region 30 of the first conductivity type. The first conductivity type is, for example, one of the n-type and the p-type. The second conductivity type is, for example, the other of the n-type and the p-type. In the following, the first conductivity type is the n-type and the second conductivity type is the p-type.

For example, at least a part of the first crystal region 41 may correspond to the first semiconductor region 10. For example, at least a part of the second crystal region 42 may correspond to the second semiconductor region 20.

The first semiconductor region 10 includes a first semiconductor portion 10a and a second semiconductor portion 10b. A direction from the second semiconductor portion 10b to the third electrode 53 is along the first direction D1. A crossing direction from the second semiconductor portion 10b to the first semiconductor portion 10a crosses the first direction D1. A direction from the first semiconductor portion 10a to the third semiconductor region 30 is along the first direction D1.

The second semiconductor region 20 includes a third semiconductor portion 20c and a fourth semiconductor portion 20d. The third semiconductor portion 20c is between the first semiconductor portion 10a and the third semiconductor region 30 in the first direction D1. The fourth semiconductor portion 20d is between a part of the second semiconductor portion 10b and the third semiconductor region 30 in the second direction D2 crossing the first direction D1. The second direction D2 is, for example, the X-axis direction.

The first electrode 51 is electrically connected to the first semiconductor region 10. The second electrode 52 is electrically connected to the third semiconductor region 30.

At least a part of the insulating portion 61 is between the second semiconductor portion 10b and the third electrode 53, and between the fourth semiconductor portion 20d and the third electrode 53.

In the semiconductor device 110, the current flowing between the first electrode 51 and the second electrode 52 can be controlled by the potential of the third electrode 53. The potential of the third electrode 53 may be a potential based on the potential of the second electrode 52. The first electrode 51 functions as, for example, a drain electrode. The second electrode 52 functions as, for example, a source electrode. The third electrode 53 functions as a gate electrode. The base body 10s is, for example, of the first conductivity type (n-type). The semiconductor device 110 is, for example, a MOSFET.

In this example, the second semiconductor region 20 includes a fifth semiconductor portion 20e. In the second direction D2, the third semiconductor region 30 is between the fourth semiconductor portion 20d and the fifth semiconductor portion 20e. The second electrode 52 is electrically connected to the fifth semiconductor portion 20e.

Figure 5:
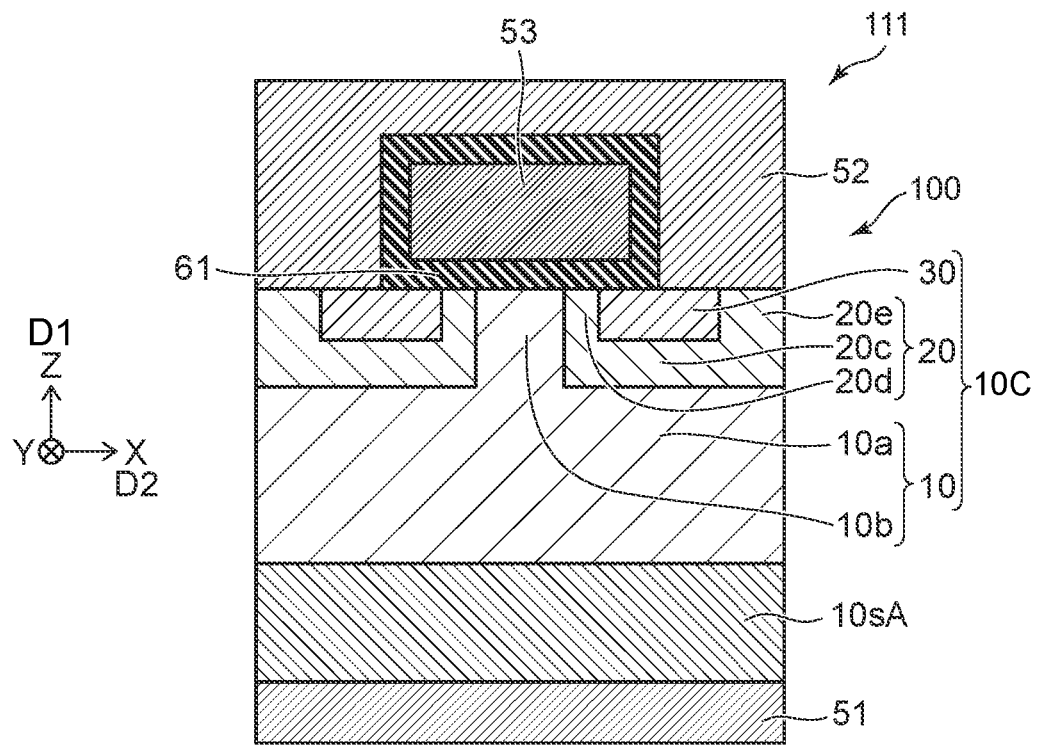
FIG. 5 is a schematic cross-sectional view illustrating a semiconductor device according to a second embodiment.

FIG. 5 is a schematic cross-sectional view illustrating a semiconductor device according to a second embodiment.

As shown in FIG. 5, in a semiconductor device 111, a base body 10sA is of the second conductivity type (p-type). Except for this, the configuration of the semiconductor device 111 is the same as the configuration of the semiconductor device 110. The semiconductor device 111 is, for example, an IGBT (Insulated Gate Bipolar Transistor).

Figure 6:
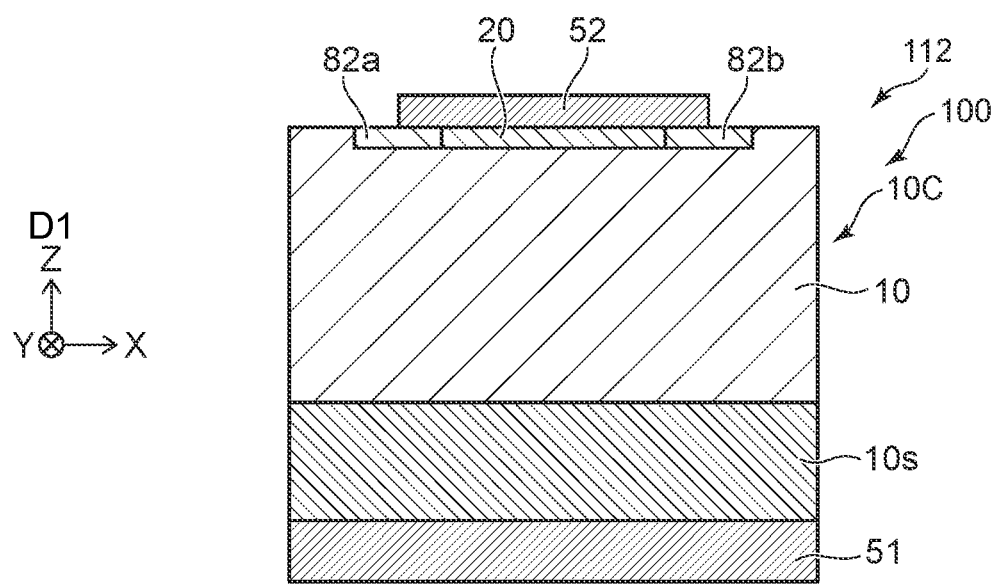
FIG. 6 is a schematic cross-sectional view illustrating a semiconductor device according to a second embodiment.

FIG. 6 is a schematic cross-sectional view illustrating a semiconductor device according to a second embodiment.

As shown in FIG. 6, a semiconductor device 112 includes at least a part of the wafer 100 and the first electrode 51 and the second electrode 52.

A direction from the first electrode 51 to the second electrode 52 is along the first direction D1. At least a part of the base body 10s is between the first electrode 51 and the second electrode 52 in the first direction D1. The crystal layer 10C includes the first semiconductor region 10 of the first conductivity type and the second semiconductor region 20 of the second conductivity type. For example, at least a part of the first crystal region 41 may correspond to the first semiconductor region 10. For example, at least a part of the second crystal region 42 may correspond to the second semiconductor region 20.

The first semiconductor region 10 is between the base body 10s and the second electrode 52. The second semiconductor region 20 is between the first semiconductor region 10 and the second electrode 52. The first electrode 51 is electrically connected to the first semiconductor region 10. The second electrode 52 is electrically connected to the second semiconductor region 20. The first electrode 51 is, for example, a cathode electrode. The second electrode 52 is, for example, an anode electrode. The semiconductor device 112 is, for example, a diode. The semiconductor device 112 may be provided with termination regions 82a and 82b.

In embodiments, at least one of the first electrode 51 or the second electrode 52 includes at least one selected from the group consisting of, for example, Al, Cu and Au. For example, the third electrode 53 (e.g., the gate electrode) includes at least one selected from the group consisting of TiN, Al, Ru, W, and TaSiN. The insulating portion 61 is, for example, silicon oxide, silicon nitride, silicon oxynitride, or the like.

In the embodiment, information on the impurity concentration can be obtained by, for example, SIMS (Secondary Ion Mass Spectrometry). In the above, the impurity concentration may be, for example, a carrier concentration. Information on the relative high and low of the impurity concentration can be obtained, for example, based on the information on the relative high and low of the carrier concentration obtained by SCM (Scanning Capacitance Microscopy). Information on crystal orientation can be obtained, for example, by X-ray diffraction analysis.

According to the embodiment, it is possible to provide a wafer and a semiconductor device capable of stabilizing the characteristics.

In the specification, "a state of electrically connected" includes a state in which multiple conductors physically contact and a current flows between the multiple conductors. "a state of electrically connected" includes a state in which another conductor is inserted between the multiple conductors and a current flows between the multiple conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in wafers such as base bodies, crystal layers, etc., and semiconductor devices such as semiconductor regions, electrodes, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all wafers, and semiconductor devices practicable by an appropriate design modification by one skilled in the art based on the wafers, and the semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:
1. A wafer, comprising:
a base body including a first surface, the base body including silicon carbide; and
a crystal layer provided on the first surface, the crystal layer including silicon carbide,
the crystal layer including a plurality of first stacking faults and one or a plurality of second stacking faults,
one of the first stacking faults including a first long side, a first short side, and a first hypotenuse, a length of the first long side being longer than a length of the first short side, an angle between the first long side and the first short side being substantially a right angle, the first long side being located in the crystal layer and extending parallel to the first surface, a position of the first long side in a first direction from the base body to the crystal layer being between a position of the base body in the first direction and a position of a first corner portion in the first direction, the first corner portion being between the first short side and the first hypotenuse, and the first short side extending in a second direction crossing the first direction,
one of the one or the plurality of second stacking faults including a second long side, a second short side, and a second hypotenuse, a length of the second long side being longer than a length of the second short side, an angle between the second long side and the second short side being substantially a right angle, the second long side extending parallel to the first surface, a position of a second corner portion in the first direction being between the position of the base body in the first direction and a position of the second long side in the first direction, the second corner portion being between the second short side and the second hypotenuse, and the second short side extending in a third direction crossing the first direction, and
a first density of the first stacking faults in the crystal layer being higher than a second density of the one or the second stacking faults in the crystal layer.
2. The wafer according to claim 1, wherein the first density is not less than 1.2 times the second density.
3. The wafer according to claim 1, wherein the first density is not less than 2 times the second density.
4. The wafer according to claim 1, wherein the first short side is shorter than the second short side.
5. The wafer according to claim 1, wherein the base body includes a plurality of basal plane dislocations,
the first short side is continuous with one of the basal plane dislocations, and
the second short side is continuous with another one of the basal plane dislocations.
6. A wafer, comprising:
a base body including a first surface, the base body including silicon carbide; and
a crystal layer having a lower side provided on the first surface, the crystal layer including silicon carbide and an upper surface opposing the lower side, the crystal layer including one or a plurality of first stacking faults, one of the one or the plurality of first stacking faults including a first long side, a first short side, and a first hypotenuse, a length of the first long side being longer than a length of the first short side, an angle between the first long side and the first short side being substantially a right angle, the first long side located in the crystal layer separated from the upper surface and extending parallel to the first surface, a position of the first long side in a first direction from the base body to the crystal layer being between a position of the base body in the first direction and a position of a first corner portion in the first direction, the first corner portion being between the first short side and the first hypotenuse, and the first short side extending in a second direction crossing the first direction, the crystal layer not including a second stacking fault, the second stacking fault including a second long side, a second short side, and a second hypotenuse, a length of the second long side being longer than a length of the second short side, an angle between the second long side and the second short side being substantially a right angle, the second long side located in the crystal layer and extending parallel to the first surface, a position of a second corner portion in the first direction being between the position of the base body in the first direction and a position of the second long side in the first direction, the second corner portion being between the second short side and the second hypotenuse.

7. The wafer according to claim 6, wherein
the base body includes a basal plane dislocation, and
the first short side is continuous with the basal plane dislocation.

8. The wafer according to claim 1, wherein
the crystal layer includes a first crystal region and a second crystal region,
the first crystal region is between the base body and the second crystal region,
the first crystal region is disposed directly on the second crystal region,
a concentration of impurity in the second crystal region is higher than a concentration of the impurity in the first crystal region, and
the position of the first corner portion in the first direction is between the position of the first long side in the first direction and a position of the second crystal region in the first direction.

9. The wafer according to claim 8, wherein
an angle θ between the first surface and a (0001) plane of the crystal layer is larger than 0 and not more than 10 degrees,
the first crystal region has a first thickness t1 along the first direction, and
a length of the first short side is smaller than t1/tan (θ).

10. The wafer according to claim 9, wherein
the first thickness t1 is not less than 5 μm and not more than 150 μm.

11. The wafer according to claim 8, wherein
a second thickness t2 of the second crystal region along the first direction is not less than 0.3 μm and not more than 3 μm.

12. The wafer according to claim 8, wherein
the impurity is of a p-type.

13. The wafer according to claim 8, wherein
the first crystal region includes at least one selected from the group consisting of N, P and As, and the second crystal region includes at least one selected from the group consisting of B, Al and Ga.

14. A semiconductor device, comprising:
a part of a wafer, the part comprising:
  a base body including a first surface, the base body including silicon carbide; and
  a crystal layer provided on the first surface, the crystal layer including silicon carbide,
  the crystal layer including a plurality of first stacking faults and one or a plurality of second stacking faults,
  one of the first stacking faults including a first long side, a first short side, and a first hypotenuse, a length of the first long side being longer than a length of the first short side, an angle between the first long side and the first short side being substantially a right angle, the first long side being located in the crystal layer and extending parallel to the first surface, a position of the first long side in a first direction from the base body to the crystal layer being between a position of the base body in the first direction and a position of a first corner portion in the first direction, the first corner portion being between the first short side and the first hypotenuse, and the first short side extending in a second direction crossing the first direction,
  one of the one or the plurality of second stacking faults including a second long side, a second short side, and a second hypotenuse, a length of the second long side being longer than a length of the second short side, an angle between the second long side and the second short side being substantially a right angle, the second long side extending parallel to the first surface, a position of a second corner portion in the first direction being between the position of the base body in the first direction and a position of the second long side in the first direction, the second corner portion being between the second short side and the second hypotenuse, and the second short side extending in a third direction crossing the first direction, and
  a first density of the first stacking faults in the crystal layer being higher than a second density of the one or the second stacking faults in the crystal layer;
a first electrode; and
a second electrode,
the first electrode being electrically connected to a part of the crystal layer, and
the second electrode being electrically connected to another part of the crystal layer.

15. The device according to claim 14, further comprising:
a third electrode; and
an insulating portion,
at a part of the base body being between the first electrode and the second electrode in the first direction,
at least a part of the crystal layer being between the base body and the second electrode in the first direction,
the crystal layer including
  a first semiconductor region of a first conductivity type,
  a second semiconductor region of a second conductivity type, and
  a third semiconductor region of the first conductivity type,
the first semiconductor region including a first semiconductor portion and a second semiconductor portion,
a direction from the second semiconductor portion to the third electrode being along the first direction, a crossing direction from the second semiconductor portion to the first semiconductor portion crossing the first direction, a direction from the first semiconductor portion to the third semiconductor region being along the first direction, the second semiconductor region including a third semiconductor portion and a fourth semiconductor portion, the third semiconductor portion being between the first semiconductor portion and the third semiconductor region in the first direction, the fourth semiconductor portion being between a part of the second semiconductor portion and the third semiconductor region in a second direction crossing the first direction, the first electrode being electrically connected to the first semiconductor region, the second electrode being electrically connected to the third semiconductor region, and at least a part of the insulating portion being between the second semiconductor portion and the third electrode, and between the fourth semiconductor portion and the third electrode.

16. The device according to claim 15, wherein the base body is of the first conductivity type.

17. The device according to claim 15, wherein the base body is of the second conductivity type.

18. The device according to claim 14, wherein a direction from the first electrode to the second electrode is along the first direction, at least a part of the base body is between the first electrode and the second electrode in the first direction, the crystal layer includes a first semiconductor region of a first conductivity type, and a second semiconductor region of a second conductivity type disposed directly on the first semiconductor region, the plurality of first stacking faults are in the first semiconductor region and not in the second semiconductor region, the first semiconductor region is between the base body and the second electrode, the second semiconductor region is between the first semiconductor region and the second electrode, the first electrode is electrically connected to the first semiconductor region, and the second electrode is electrically connected to the second semiconductor region.

19. The wafer according to claim 1, wherein the crystal layer includes a first semiconductor region of a first conductivity type, and a second semiconductor region of a second conductivity type disposed directly on the first semiconductor region, the plurality of first stacking faults are disposed in the first semiconductor region and not in the second semiconductor region, and the first semiconductor region has a higher concentration of impurities than a concentration of impurities in the second semiconductor region.

20. The wafer according to claim 1, wherein the first short side extends along a [11-20] direction of the crystal layer, and the second short side extends along the [11-20] direction.

* * * * *